United States Patent [19]
Goela et al.

[11] Patent Number: 6,083,561
[45] Date of Patent: Jul. 4, 2000

[54] LOW SCATTER, HIGH QUALITY WATER CLEAR ZINC SULFIDE

[75] Inventors: Jitendra Singh Goela, Andover, Mass.; Zlatko Salihbegovic, New Iberia, La.

[73] Assignee: CVD, Inc., Woburn, Mass.

[21] Appl. No.: 09/018,969

[22] Filed: Feb. 5, 1998

[51] Int. Cl.[7] .................................................. C23C 16/30
[52] U.S. Cl. .............................. 427/255.33; 427/255.31; 427/166
[58] Field of Search ................................ 427/255.2, 255.1, 427/126.1, 166, 255.33, 255.31, 255.29, 255.23

[56] References Cited

U.S. PATENT DOCUMENTS

| | | | |
|---|---|---|---|
| 4,944,900 | 7/1990 | Willingham et al. ................ 264/1.2 |
| 4,978,577 | 12/1990 | Purohit et al. ....................... 428/409 |
| 5,077,092 | 12/1991 | Smith et al. ........................ 427/255.2 |
| 5,686,195 | 11/1997 | Taylor et al. ......................... 428/698 |

*Primary Examiner*—Roy V King

[57] ABSTRACT

An improved chemical vapor deposition (CVD) process which is capable of providing low-scatter water-clear zinc sulfide bulk material is described. The improved method also minimizes bowing, or induced curvature, in the product bulk material. The product zinc sulfide material can be processed into thicker windows and optical devices than was possible with the articles produced by the previous CVD process. The improved process provides for a controlled gradual initial ramping up of the deposition rate and a controlled initial ramping down of the substrate temperature.

15 Claims, 1 Drawing Sheet

LOW SCATTER, HIGH QUALITY WATER CLEAR ZINC SULFIDE

BACKGROUND OF THE INVENTION

1. Field of the Invention

Zinc sulfide is a durable material which intrinsically is transparent to relatively long electromagnetic wavelengths in the far-infrared range. These properties contribute to its use in applications which require infrared transmission capability such as in infrared detectors and missile domes. Zinc sulfide forms or articles are typically produced by chemical vapor deposition (CVD) or hot pressing techniques. These techniques result in forms which are generally opaque and not functionally transparent in the visible or near-infrared regions of the electromagnetic spectrum. Hot-isostatic pressing (HIP) has been found to sufficiently improve the transparency of zinc sulfide articles in the visible and near-ultraviolet regions that these forms can be used in applications requiring multi-spectral capability, such as in tank and aircraft windows. However, the visual transparency and clarity of such articles is less than desirable restricting the use of these articles in applications which require optical clarity. This invention relates to improvements in the CVD process which result in articles having significantly improved visual clarity after HIP treatment.

2. Description of Related Art

Chemical vapor deposition has been used to produce zinc sulfide in bulk form or in the form of a layered coating on a substrate. Typically such production involves the reaction of $H_2S$ with vaporized zinc in proximity to either a substrate or a mandrel box on which the zinc sulfide deposits, such as is described in U.S. Pat. No. 5,686,195. The zinc sulfide deposits produced by this CVD method generally exhibit poor transmission in the visible and near-infrared regions of the electromagnetic spectrum. The transmission properties in these regions can be substantially improved by hot isostatic pressing (HIP) of the CVD produced form as described in U.S. Pat. No. 4,944,900.

A moderately clear ZnS has previously been commercially produced by a two-step process. First, elemental zinc vapors are reacted with hydrogen sulfide at a $H_2S/Zn$ molar ratio of 1, a mandrel temperature of 735° C. and an absolute pressure of 35 torr, in a CVD reactor. Zinc sulfide is deposited on the mandrel until a deposit of the desired thickness is produced. The deposit is separated from the mandrel to provide a zinc sulfide form which is then HIP treated for up to 100 hours at 900–1000° C. and pressures of 15,000–30,000 psi. While the clarity of an image transmitted through the zinc sulfide form is substantially improved by the HIP treatment, it is not adequate for applications requiring image transmission through relatively thick forms or for optical applications with prisms or the like. Such clarity of image is related to the forward scatter value of a beam from a He—Ne laser as measured by a scatterometer. The forward scatter of zinc sulfide products of the above noted HIP treatment have typically varied between 10 and 40% $cm^{-1}$. For imaging applications, such as required in military aircraft and vehicles, the scatter value should be as low as possible, many such applications requiring scatter values less than 7% $cm^{-1}$. Previous attempts to improve these scatter values resulted in increased inclusions in the material, which degrade its transmission and optical quality, and also produced bowing, or induced curvature, in the material, which can cause cracking and reduce the yield of flat plates.

Accordingly, a need has existed for a reliable method of producing zinc sulfide articles having improved transmission and clarity in the visible and near-infrared electromagnetic wavebands, while avoiding increasing inclusions and/or bowing in the product articles. The present invention provides zinc sulfide articles having enhanced extended transparency in the visible range which permits their use in optical applications, such as for lenses, prisms, windows, etc., and other applications which take advantage of its high refractive index.

Moreover, bulk materials derived from CVD produced deposits often encounter induced curvature, or bowing, which, as with the zinc sulfide products discussed above, can result in cracks appearing in the product as well as reducing the yield of flat plates or articles. Accordingly, a general need exists for improved CVD processes which reduce the incidence and severity of bowing in the bulk product.

SUMMARY OF THE INVENTION

The invention provides a method of producing high quality, water-clear, low scatter zinc sulfide (ZnS) articles having greatly improved scatter, transmission and visual/optical quality features. Modification of the processing conditions of the CVD process, while continuing the same conditions as used before in the HIP process, has resulted in water-clear zinc sulfide articles having high visible and near-infrared wavelength transmission, controlled bowing and forward scatter values consistently less than 7% $cm^{-1}$.

The modified CVD process conditions include (a) lowering the mandrel, or substrate, temperature from 735° C. to lower operative processing temperatures, preferably less than 680°, with a higher initial temperature provided at the initiation of each run which is gradually ramped down to the intended processing temperature, (b) decreasing the $H_2S/Zn$ molar ratio from 1 to a value less than 0.8, (c) initiating the flow of vaporized zinc to the deposition zone slowly at the beginning of each run by slowly ramping up the temperature of the vaporized zinc produced in the retort, and (d) maintaining the mandrel temperature at least 10° C. above the temperature of the zinc in the retort.

BRIEF DESCRIPTION OF THE DRAWING

The drawing schematically illustrates a chemical vapor deposition furnace in which the present inventive process can be conducted.

DETAILED DESCRIPTION OF THE INVENTION

Figure 1:
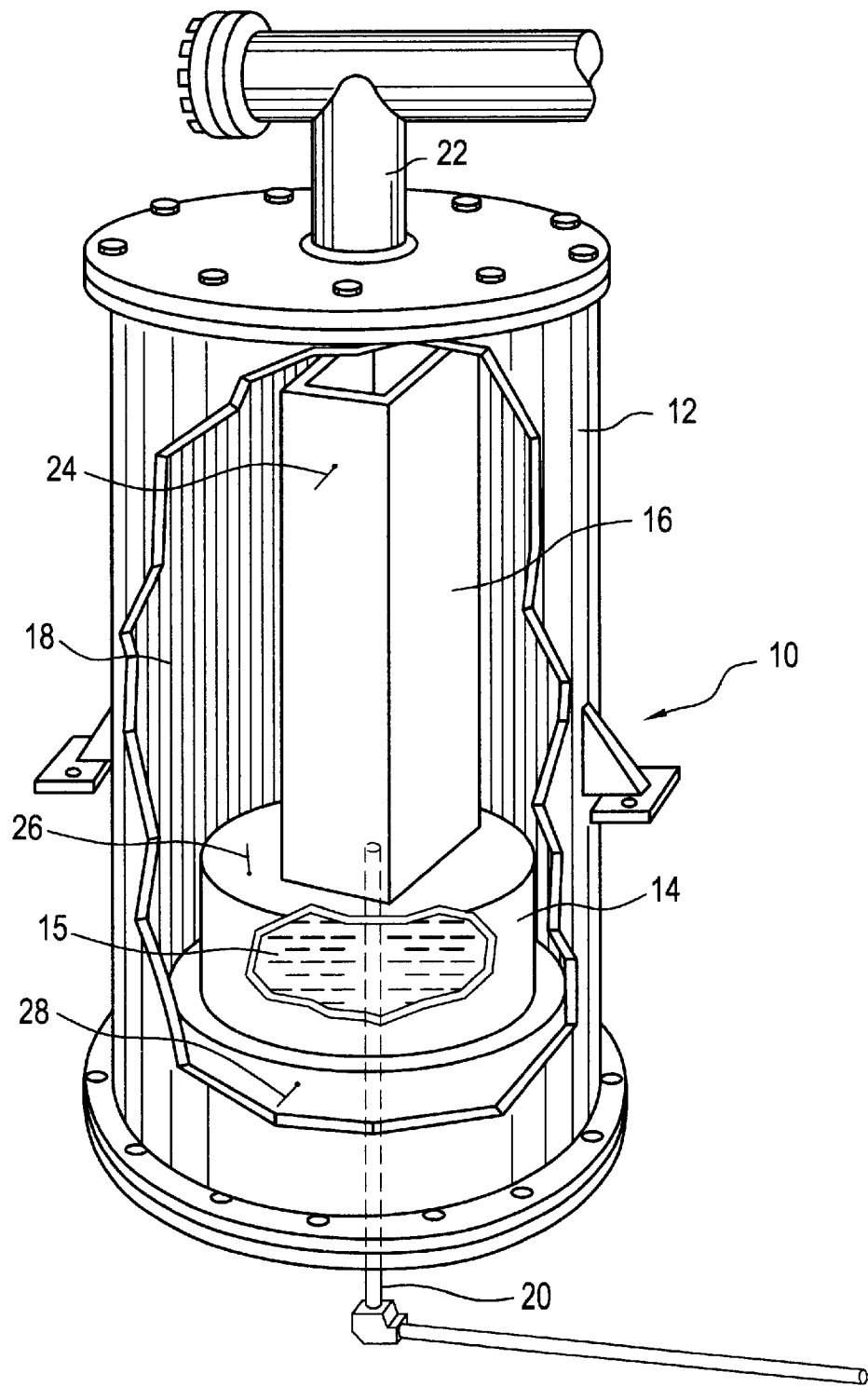

A furnace for producing sheets of CVD zinc sulfide is schematically illustrated in the FIGURE. The furnace 10 is enclosed in a vertically oriented water cooled stainless steel vacuum chamber housing 12. A graphite retort 14 containing molten zinc 15 and provided with a first heating means, such as resistance and/or radiant heating elements, is provided near the bottom of the chamber 12. A rectangular graphite mandrel 16 is arranged above the zinc retort 14 with its interior in flow communication with the retort. Second heating means 18 capable of heating the graphite mandrel are provided around the mandrel's exterior. A gas injector 20 provides hydrogen sulfide ($H_2S$) and an inert carrier gas to the lower portion of the mandrel's interior. The gas exhaust 22 at the top of the housing 12 is operatively connected to a filtration system (not shown) to remove particulates, then to a vacuum source, such as a vacuum pump (not shown) and finally to a scrubber (not shown) to remove unreacted $H_2S$ and any other toxic products. The temperature of the mandrel is measured by a thermocouple 24 touching the mandrel at its external surface. The temperature of the zinc in the retort is measured by averaging the temperature measurements of two thermocouples, one 26 touching the upper portion of the retort's wall (above/near the level of molten zinc) and another thermocouple 28 extending to the lower portion of the retort's wall (below the level of molten zinc).

In operation, elemental zinc vaporized in the zinc retort 14 at a first temperature is mixed with the injected $H_2S$ and carrier gas as they enter the mandrel 16. The mixed gases are caused to flow through the interior of the graphite mandrel wherein they contact the heated mandrel and are heated to a second, or substrate, temperature causing the zinc and $H_2S$ to react forming ZnS on the interior surfaces of the mandrel 16. The carrier gas and any gaseous or entrained reaction products are removed from the chamber at the gas exhaust 22 and processed through the filtration and scrubbing systems. Once started, the process is continued until the desired thickness of zinc sulfide is deposited on the graphite mandrel, which takes more than 15 hours and can take up to 1100 hours, and typically takes between 100 and 600 hours. When the desired thickness is achieved the gas flow through the gas injector 20 is discontinued, the first heating means is turned down, the second heating means 18 is turned off, the chamber housing 12 is opened and the graphite mandrel 16 is removed. The zinc sulfide sheets deposited on the interior walls of the mandrel are then removed therefrom and cut into sheets of the desired size.

The sheets are machined to remove graphite contaminants on the substrate, or mandrel, side and are machined to smooth the deposition side. The sheets are then treated (hipped) by a HIP process which typically subjects them to high temperature (900°–1000° C.) and isostatic high pressure (15,000–30,000 psi) for an extended time up to 150 hours.

The inventive improved process provides for initiating each run at a mandrel temperature (substrate temperature) of 690° C. or higher, and gradually decreasing, or ramping down, the mandrel temperature by at least 10° C. to a target mandrel temperature less than 680° C., and preferably within the range of 660° C. to 680° C. over the course of the first 5 to 20 hours of the run, preferably during the first 8 to 15 hours, and then maintaining the target mandrel temperature for the remainder of the run. We have found that by initially providing a higher mandrel temperature which is slowly ramped down to the target temperature, the nucleation density of the first deposited layer is decreased and bowing of the product sheet is diminished.

The present process also provides for sustaining a stoichiometric excess of zinc in the deposition zone after an initial ramping up of the zinc vapor concentration in the gas mixture supplied to the deposition zone. Previously, in a typical run, a $H_2S/Zn$ molar ratio of 1 was provided to the deposition zone. While some previous runs had attempted $H_2S/Zn$ molar ratios within the range of 0.6–0.75, the product of these runs had increased inclusion levels. The zinc vapor flow rate is dependent on the zinc retort temperature, the operating pressure, and the flow rate of the total feed gas mixture, including the $H_2S$ and the carrier gas as well as the zinc vapor. Our process provides a $H_2S/Zn$ molar ratio of less than 0.8, preferably of 0.6 to 0.8 after an initial ramping up of the zinc vapor concentration. During the initial ramping up the flow of zinc vapor is initiated at a minimal value at the beginning of each run and is slowly increased, or ramped up, to the target, or sustained, flow rate over the initial 10 to 90 hours and, preferably, over the initial 30 to 60 hours, of the run. Usually, such is accomplished by initially setting and then maintaining the $H_2S$ and carrier gas flow rates while slowly ramping up the zinc retort temperature. We have found that this procedure minimizes up and down fluctuations in the zinc flow rate and minimizes minute deposits of zinc metal on the mandrel which, otherwise, would eventually appear as inclusions in the zinc sulfide article. This procedure provides a lower initial deposition rate and an initially decreasing $H_2S/Zn$ molar ratio, both of which also contribute to controlling bowing in the product article.

Finally, in our process the zinc retort temperature is always maintained at least 10° C. lower, preferably at least 15° C. lower, and most preferably 20° C. lower, than the mandrel, or substrate, temperature. This requirement has been found to diminish zinc condensation in the deposition zone, thereby further avoiding inclusions in the product.

The present process operates under reduced pressure at a furnace absolute pressure of less than 60 torr, preferably 30 to 40 torr. The conditions of the previous post deposition HIP process are continued in the post treatment of the present CVD product.

EXAMPLE 1

The zinc retort in a furnace similar to that illustrated in the FIGURE was initially heated to a temperature above 575° C. The absolute pressure in the furnace was adjusted to 35 torr. Argon was introduced as a carrier gas at a flow rate of 113.1 slpm (standard liters per minute). Hydrogen sulfide was provided at a flow rate of 9.3 slpm. The Zn vapor flow rate was ramped up to a target flow rate of 12.43 slpm by increasing the average zinc temperature in the retort from 597.5° C. to 647° C. during the first 72 hours of the run. These zinc and $H_2S$ flow rates provide a $H_2S/Zn$ molar ratio of 0.75, which ratio was maintained throughout the run. The initial furnace temperature of 687° C. was ramped down to a target temperature of 672° C. during the first 10 hours of deposition, whereby the furnace temperature was maintained at least 25° C. above the temperature of the zinc in the retort. The deposition was continued for 350 hours and resulted in 947 pounds of deposited zinc sulfide. The average deposition rate was 0.00211 inch/hour.

The CVD product was cut into plates, which were machined to remove graphite contaminants from the substrate side and to smooth the deposition side. The plates were wrapped in platinum foil and then Hipped at 990° C. and 21,000 psi for 70 hours. The plates were then lapped and polished. Inspection with a bright fiber optic light focussed from the side of the plate failed to reveal any inclusions >0.1 mm in diameter. Measurement of the forward scatter of ten 1 inch diameter, 10.08 mm thick samples at a half cone angle of 0.5–3 degrees from the direction of a beam provided from a He—Ne laser (wavelength of 632.8 nm or 0.6328 micron) in a scatterometer, provided scatter values in the range of 4.3 to 7.4% $cm^{-1}$, with an average scatter value of 5.5% $cm^{-1}$. Transmission values measured with a spectrophotometer were 56.3 to 58.8% at the 450 nm wavelength and 63.34 to 64.54% at the 550 nm wavelength. Thus, the process provided a low scatter, high transmission zinc sulfide plate with no visible inclusions.

EXAMPLE 2

In this example furnace pressure and Hipping conditions were the same as in Example 1. The average zinc temperature in the retort was ramped up during the first 50 hours of the deposition from 610.5° C. to 651° C. The mandrel temperature was ramped down during the first ten hours of operation from 690° C. to 674° C. The zinc target flow rate was 13.3 slpm, while the hydrogen sulfide and argon flow rates were the same as in Example 1, providing a $H_2S/Zn$ molar ratio of 0.7. The deposition continued for 300 hours, during which the mandrel temperature exceeded the zinc retort temperature by at least 23° C.

Fifteen 0.8 cm thick samples demonstrated excellent inclusion quality with no inclusions >0.1 mm diameter detected. The forward scatter values ranged between 3.83–5.27% $cm^{-1}$, with an average value of 4.90% $cm^{-1}$. The visible transmission values ranged from 58.4% to 58.6% at the 450 nm wavelength, and from 64.7% to 66.1% at the 550 nm wavelength. Thus, lowering the $H_2S/Zn$ molar ratio from 0.75 to 0.70 improved the average forward scatter values without affecting the optical quality.

EXAMPLE 3

In this example the average zinc retort temperature was ramped up from 621.5° C. to 648.5° C. during the first sixteen hours of the deposition. The mandrel temperature was ramped down from 708° C. to 676° C. The target flow rate of zinc vapor was 15.24 slpm, while the flow rates of hydrogen sulfide and argon were maintained as in Example 1, resulting in a $H_2S/Zn$ molar ratio of 0.61. The furnace pressure was the same as in Example 1. The deposition continued for 350 hours during which a >25° C. difference was maintained between the mandrel and zinc retort temperatures. The deposit was removed from the mandrel and Hipped at 990° C. and 15,000 psi for 90 hours.

Inspection of 0.83 thick samples rated them good for inclusion quality although they were not as good as the samples from Examples 1 and 2. Moreover, the product plates demonstrated greater bowing than the plates produced in Examples 1 and 2. Forward scatter values were in the range of 4.67 to 6.24% $cm^{-1}$, with an average value of 4.85% $cm^{-1}$. The diminished bowing and inclusion quality is believed to be attributable to not providing sufficient time for ramping up the zinc vapor flow and to the relatively low value of the molar ratio.

EXAMPLE 4

In this example the average zinc retort temperature was ramped up from 630.5° C. to 648° C. during the first 50 hours of the deposition. The mandrel temperature was ramped down from 689° C. to 669° C. over the first 10 hours of the deposition. The zinc vapor target flow rate was 14.1 slpm and the argon and $H_2S$ flow rates were essentially the same as in the previous examples. This resulted in a $H_2S/Zn$ molar ratio of 0.65. The furnace pressure and HIP conditions were essentially the same as in the preceding examples.

The plates produced from this run demonstrated less bowing than the plates produced from Example 3, but showed greater bowing than did the plates resulting from Example 2. The inclusion quality was excellent with no inclusions >0.1 mm detected.

The minimized bowing is believed to result from decreasing the nucleation density and from providing a gradual increase, or ramping up, of the ZnS deposition rate at the beginning of the deposition. The nucleation density is decreased by initially providing the mandrel at a temperature at least 10° C. above its target temperature and gradually reducing its temperature to the target temperature over the first 10 or more hours of the deposition. A gradual increase of the deposition rate is usually accomplished by an initial gradual ramping up of the zinc flow rate controlled by initially gradually ramping up the zinc retort temperature over the initial 10 to 90 hours of the deposition.

Zinc sulfide plates produced by the inventive process which demonstrate forward scatter values of less than 7% $cm^{-1}$ have been processed into optical prisms and thick windows and lenses having enhanced clarity and satisfactory performance otherwise. The plates produced prior to this invention were not considered to be suitable for processing into such articles because their optical clarity was insufficient for these applications.

The foregoing is provided to enable workers in the art to practice the invention and to describe what is presently considered to be the best mode of practicing the invention. The scope of the invention is defined by the following claims.

We claim:

1. A process for producing a clear zinc sulfide article, comprising:

(a) providing a substrate in a chamber maintained at a reduced pressure;

(b) providing a mixture of zinc vapor (Zn) and hydrogen sulfide ($H_2S$) in the vicinity of said substrate causing zinc sulfide to deposit on said substrate;

(c) initially providing an initial concentration of said zinc vapor to said mixture from a molten zinc source;

(d) initially providing said substrate at an initial temperature of at least 690° C.;

(e) gradually increasing the zinc vapor in said mixture from its initial concentration to its target concentration;

(f) gradually decreasing the temperature of said substrate to a target temperature;

(g) maintaining a $H_2S/Zn$ molar ratio of up to 0.8 in said mixture after said zinc vapor in said mixture has reached its target concentration;

(h) maintaining at least 10° C. separation between the temperature of said molten zinc and the temperature of said substrate;

(i) recovering said zinc sulfide deposit; and (j) processing said recovered deposit to produce the clear zinc sulfide article.

2. The process of claim 1 wherein:

the step of gradually increasing the zinc vapor in said mixture comprises gradually increasing the temperature of said molten zinc source at least 10° C. above its initial temperature.

3. The process of claim 1 wherein:

the concentration of said zinc vapor in said mixture reaches its target concentration during the first 10 to 90 hours following initiation of the deposition.

4. The process of claim 3 wherein:

said concentration of said zinc vapor in said mixture reaches its target concentration during the first 30 to 60 hours following initiation of the deposition.

5. The process of claim 1 wherein:

said substrate reaches its target temperature during the first 5 to 20 hours following initiation of the deposition.

6. The process of claim 5 wherein:

said substrate reaches its target temperature during the first 8 to 15 hours following initiation of the deposition.

7. The process of claim 1 wherein:

said target temperature of said substrate is at least 10° C. lower than said initial temperature of said substrate.

8. The process of claim 1 wherein:

said target temperature of said substrate is less than 680° C.

9. The process of claim 1 wherein:

said reduced pressure is less than 60 torr.

10. The process of claim 1 wherein:

said clear zinc sulfide article requires sufficiently clear image transmission that it is capable of transmitting a 0.6328 wavelength light beam from a He—Ne laser with less than 7% cm$^{-1}$ forward scatter.

11. The process of claim 1 wherein:

said H$_2$S/Zn molar ratio is maintained within the range of 0.6 to 0.75.

12. The process of claim 1 wherein:

a separation of at least 15° C. is maintained between the temperature of said molten zinc and the temperature of said substrate.

13. A process for producing a clear zinc sulfide article, comprising:

(a) providing a substrate in a chamber maintained at a reduced pressure;

(b) providing a mixture of zinc vapor (Zn) and hydrogen sulfide (H$_2$S) to the vicinity of said substrate causing zinc sulfide to deposit on said substrate;

(c) providing an initial concentration of said zinc vapor to said mixture from a molten zinc source;

(d) initially providing said substrate at an initial temperature of at least 690° C.;

(e) gradually increasing the zinc vapor in said mixture from its initial concentration to its target concentration;

(f) gradually decreasing the temperature of said substrate to a target temperature at least 10° C. below its initial temperature;

(g) maintaining a H$_2$S/Zn molar ratio of less than 0.8 in said mixture after the concentration of said zinc vapor in said mixture has reached its target concentration;

(h) maintaining at least 10° C. separation between the temperature of said molten zinc and the temperature of said substrate;

(i) recovering said zinc sulfide deposit; and (j) processing said recovered deposit to produce the clear zinc sulfide article which requires sufficiently clear image transmission that it is capable of transmitting a 0.6328 micron wavelength light beam from a He—Ne laser with less than 7% cm$^{-1}$ forward scatter.

14. The process of claim 13 wherein:

the step of gradually increasing the zinc vapor in said mixture comprises gradually raising the temperature of said molten zinc source at least 10° C. above its initial temperature.

15. The process of claim 13 wherein:

a separation of at least 15° C. is maintained between the temperature of said molten zinc and the temperature of said substrate.

* * * * *